(12) United States Patent
Chen

(10) Patent No.: US 7,888,970 B1
(45) Date of Patent: Feb. 15, 2011

(54) SWITCH CONTROLLING CIRCUIT, SWITCH CIRCUIT UTILIZING THE SWITCH CONTROLLING CIRCUIT AND METHODS THEREOF

(75) Inventor: Wang-Chin Chen, Kaohsiung County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/512,015

(22) Filed: Jul. 29, 2009

(51) Int. Cl.
*H03K 19/00* (2006.01)
(52) U.S. Cl. ............................. 326/93; 326/31; 327/538
(58) Field of Classification Search .................... 326/93, 326/31, 33; 327/530, 538–543
See application file for complete search history.

(56) References Cited

U.S. PATENT DOCUMENTS

| | | | | |
|---|---|---|---|---|
| 3,604,947 A | * | 9/1971 | Puthuff | ........................ 327/555 |
| 5,391,938 A | * | 2/1995 | Hatsuda | ........................ 327/71 |
| 7,365,595 B2 | * | 4/2008 | Lee | ............................. 327/538 |
| 2007/0273412 A1 | * | 11/2007 | Yoshida et al. | .............. 327/108 |
| 2009/0066681 A1 | * | 3/2009 | Kim et al. | .................... 345/210 |

* cited by examiner

*Primary Examiner*—James Cho
(74) *Attorney, Agent, or Firm*—Winston Hsu; Scott Margo

(57) ABSTRACT

A switch controlling circuit, which comprises: a frequency programmable clock signal generator and a plurality of registers. The frequency programmable clock signal generator serves to generate a frequency controllable clock signal. The registers comprises: a first stage register, for receiving an input signal and the frequency controllable clock signal, and for outputting a first output signal, which is utilized to control a first switch device, according to the input signal and the frequency controllable clock signal; and a second stage register, for receiving the first output signal and the frequency controllable clock signal, and for outputting a second output signal, which is utilized to control a second switch device, according to the first output signal and the frequency controllable clock signal.

17 Claims, 6 Drawing Sheets

US 7,888,970 B1

SWITCH CONTROLLING CIRCUIT, SWITCH CIRCUIT UTILIZING THE SWITCH CONTROLLING CIRCUIT AND METHODS THEREOF

BACKGROUND OF THE INVENTION

1. Field of the Invention

The present invention relates to a switch controlling circuit, a switch circuit utilizing the switch controlling circuit, and methods thereof, and particularly relates to a switch controlling circuit that can avoid rush current, a switch circuit utilizing the switch controlling circuit, and methods thereof.

2. Description of the Prior Art

FIG. 1 is a circuit diagram illustrating a prior art switch circuit (or called a power switch circuit) 100. As shown in FIG. 1, the switch circuit 100 includes a plurality of switch units 101, 103, and 105 and is located between a supply voltage level $V_{cc}$ and a logic circuit 107. Such circuit structure is called a header type switch circuit, and the transistor in each switching unit is a P-MOSFET. The switch circuit 100 turns on or off, to provide a current to the logic circuit 107.

FIG. 2 is a circuit diagram illustrating another prior art switch circuit 200. As shown in FIG. 2, the switch circuit 200 includes a plurality of switch units 201, 203, and 205 and is located between a voltage level $V_{GND}$ and a logic circuit 207. Such circuit structure is called a footer type switch circuit, and the transistor in each switching unit is an N-MOSFET. The switch circuit 200 turns on or off, to sink a current from the logic circuit 207.

However, both of the switch circuits include the same disadvantages: the switch units thereof will turn on at the same time. Therefore, the power supply will charge the decoupling capacitance in the logic circuit. Due to the decoupling capacitance does not have any charges before power switch turns on so that the decoupling capacitance will suffer a large instantaneous current (or called a rush current) when the switch units turn on simultaneously. The large instantaneous current may causes large IR drop and may causes function errors in logic circuits that are in another power domain.

SUMMARY OF THE INVENTION

Therefore, one objective of the present invention is to provide a switch controlling mechanism to avoid rush current of the switch circuit.

One embodiment of the present invention discloses a switch controlling circuit, which comprises: a frequency programmable clock signal generator and a plurality of registers. The frequency programmable clock signal generator serves to generate a frequency controllable clock signal. The registers comprises: a first stage register, for receiving an input signal and the frequency controllable clock signal, and for outputting a first output signal, which is utilized to control a first switch device, according to the input signal and the frequency controllable clock signal; and a second stage register, for receiving the first output signal and the frequency controllable clock signal, and for outputting a second output signal, which is utilized to control a second switch device, according to the first output signal and the frequency controllable clock signal.

Another embodiment of the present invention discloses a switch circuit, which comprises: a first switch device, a second switch device, a frequency programmable clock signal generator and a plurality of registers. The frequency programmable clock signal generator serves to generate a frequency controllable clock signal. The registers, comprises: a first stage register, for receiving an input signal and the frequency controllable clock signal, and for outputting a first output signal, which is utilized to control the first switch device, according to the input signal and the frequency controllable clock signal; and a second stage register, for receiving the first output signal and the frequency controllable clock signal, and for outputting a second output signal, which is utilized to control the second switch device, according to the first output signal and the frequency controllable clock signal.

Another embodiment of the present invention discloses a switch controlling method, which comprises: generating a frequency controllable clock signal; receiving an input signal and the frequency controllable clock signal to output a first output signal, which is utilized to control a first switch device, according to the input signal and the frequency controllable clock signal; and receiving the first output signal and the frequency controllable clock signal to output a second output signal, which is utilized to control a second switch device, according to the first output signal and the frequency controllable clock signal.

According to above-mentioned embodiments, rush current of the prior art can be reduced and the operation of the switch circuit can automatically stop when a last stage switch device turns off.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
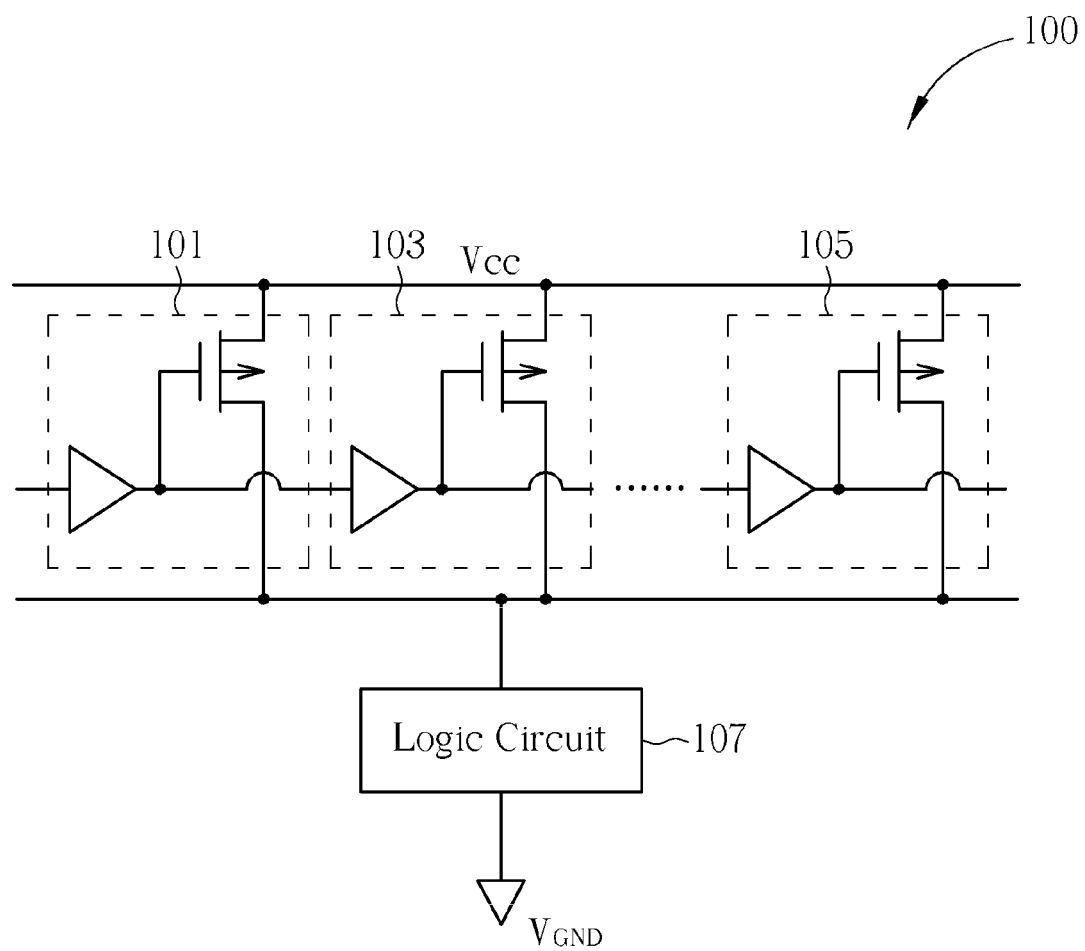
FIG. 1 is a circuit diagram illustrating a prior art switch circuit.
Figure 2:
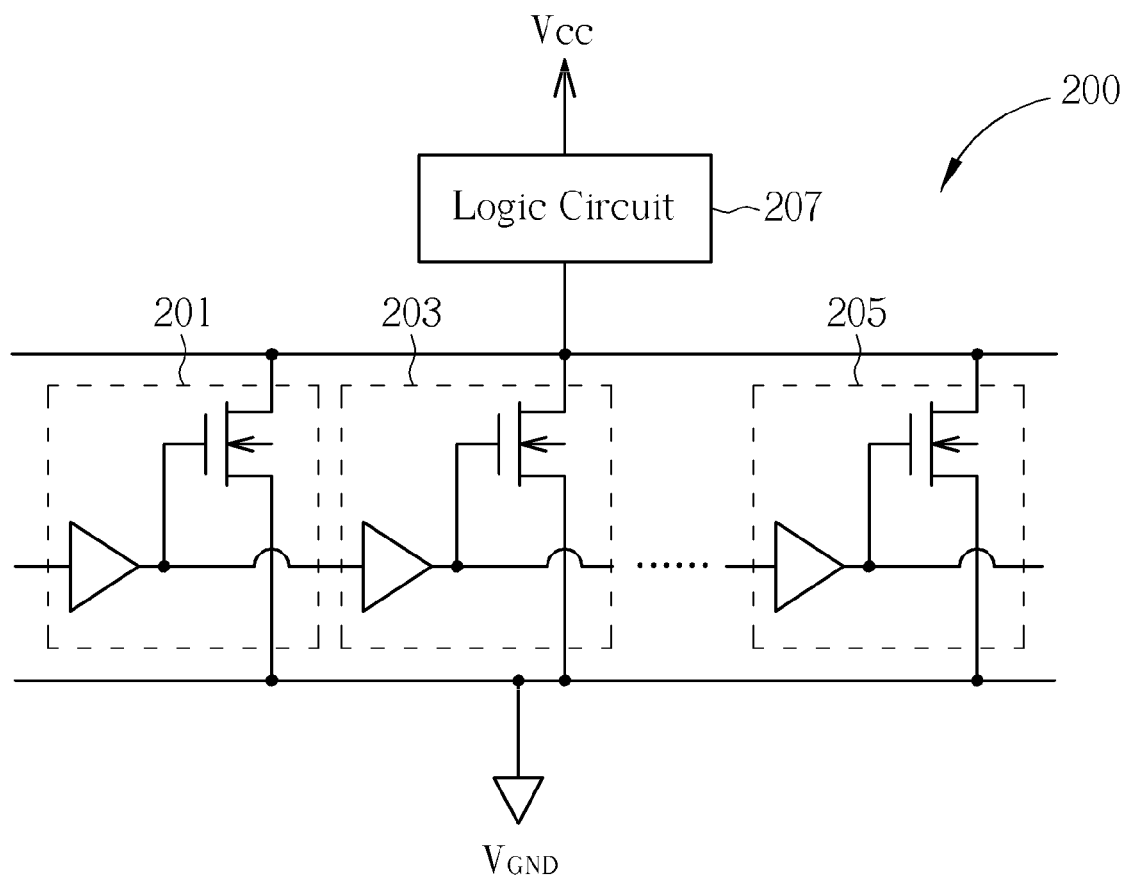
FIG. 2 is a circuit diagram illustrating a prior art switch circuit.
Figure 3:
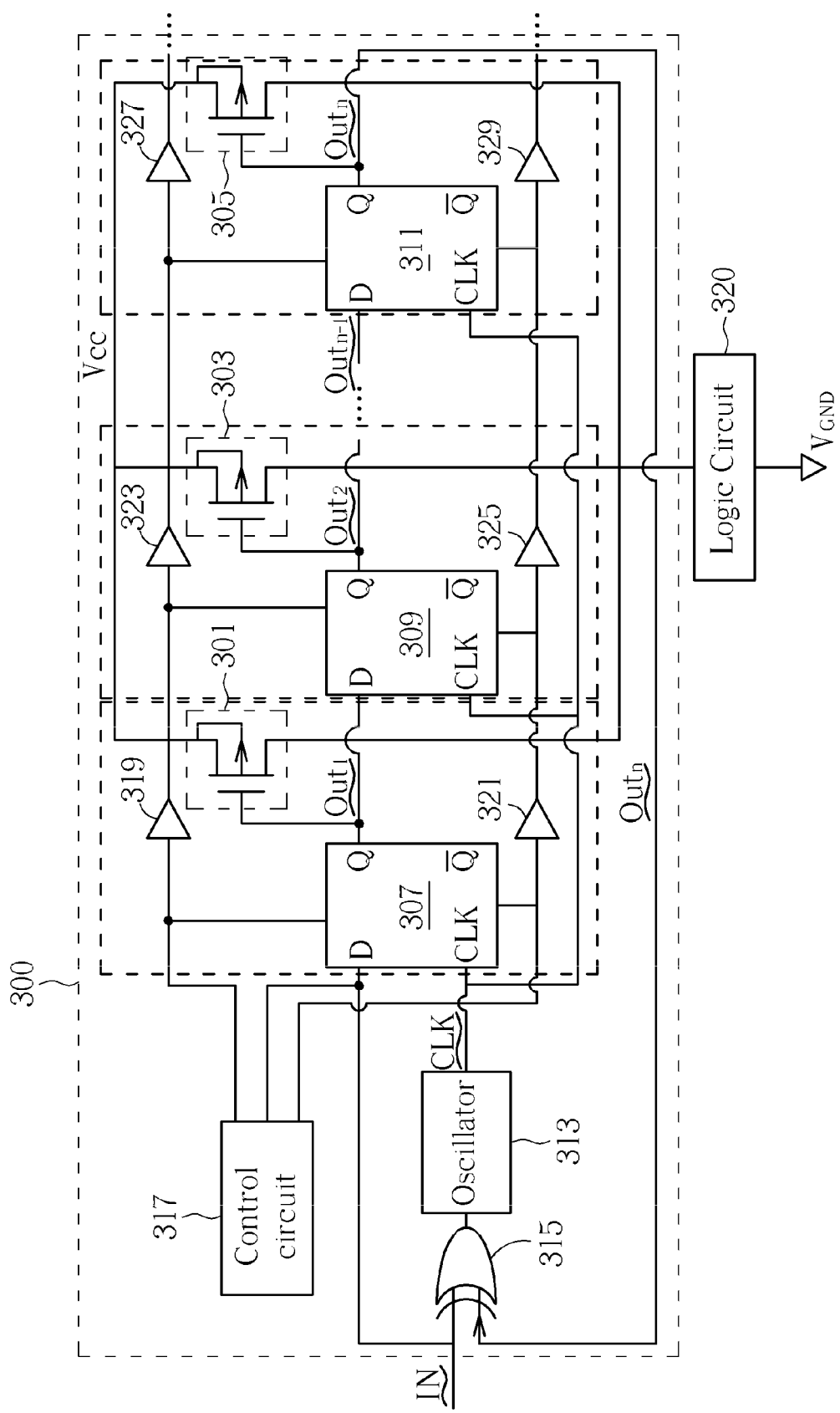
FIG. 3 is a circuit diagram illustrating a switch circuit according to a first embodiment of the present invention.

FIG. 3 is a circuit diagram illustrating a switch circuit 300 according to a first embodiment of the present invention, which is a header type switch circuit. As shown in FIG. 3, the switch circuit 300 is located between a supply voltage level $V_{cc}$ and a logic circuit 320. The switch circuit 300 includes a plurality of switch devices 301, 303 and 305 (P-MOS in this case, and only three of the switch devices are illustrated), a plurality of registers 307, 309 and 311 (D flip flop in this case, and only three of the registers are illustrated), an frequency programmable oscillator 313, and a logic unit 315 (XOR unit in this case). The oscillator 313 generates a frequency controllable clock signal CLK, which has a controllable frequency.

Initially, the switch devices 301, 303 and 305 are turned off (i.e, all output nodes of registers are set to logic "1"). To start the turn on/off sequence of 301, 303 and 305, a logic "1" is applied to input node IN. XOR unit 315 will output logic value "1" and enable the oscillators. Accordingly, turn on/off of the switch devices 301, 303 and 305 is controlled by input signal IN. In this case, switch device is turned on when input signal IN is logic 0 or logic 1 turns off switch device.

The register 307 outputs a first output signal $OUT_1$ according to an input signal IN and the clock signal CLK. Since the register 307 is a D flip flop in this case, the relations between the input signal IN, the clock signal CLK and the first output signal $OUT_1$ can be shown as Table 1:

TABLE 1

| IN | CLK | $OUT_1$ |
|---|---|---|
| 0 | Rising edge | 0 |
| 1 | Rising edge | 1 |

Therefore, the switch device 301 can turn on/off according to the first output signal $OUT_1$. In this case, the switch device 301 turns on when the first output signal $OUT_1$ includes a logic value 0, since the switch device 301 is a P-MOSFET in this embodiment. The register 309 outputs a second output signal $OUT_2$ according to the first output signal $OUT_1$ and the clock signal CLK. Thus the second output signal $OUT_2$ will have a logic value 0 when the first output signal $OUT_1$ has a logic value 0 and the clock signal CLK has a rising edge. By this way, the second output signal $OUT_2$ will be the same as output signal $OUT_1$ when next clock rising edge occurs. Accordingly, the turning on time of the switch device 303 will be later than which of the switch device 301, depending on the frequency of the clock signal CLK. According to the same rules, the turn on time of each register will be later than which of a previous stage register.

For above mentioned embodiment, the value of Max Rush Current can be estimated according to the equations (1), (2), (3):

$$\text{Max } I_{rush} = \frac{T}{t} \times I_{sat} \quad \text{Eq (1)}$$

$$T = \frac{C \times (V_{sg} - |V_{th}|)}{I_{sat}} \quad \text{Eq (2)}$$

Combining Eq (1) and Eq (2), Eq (3) can be obtained:

$$\text{Max } I_{rush} = \frac{C \times (V_{sg} - |V_{th}|)}{t} \quad \text{Eq (3)}$$

$V_{th}$ indicates the threshold value of P-MOSFET. T is the time that the capacitors in the logic circuit 320 are charged to a specific voltage level V such that the P-MOSFET changes from a saturation region to a linear region. That is, since the capacitors in the logic circuit initially include no charge therein, the P-MOSFETs of the switch circuit according to the embodiment of the present invention initially operate at a saturation region, thus the current flowing through the P-MOSFETs is saturation current. As time goes by, the capacitors accumulate some charge and voltage level thereon goes up. Accordingly, the voltage between a drain terminal and a source terminal of the P-MOSFET decreases and the P-MOSFET gradually operates from the saturation region to the linear region. Besides, t is a cycle time of the oscillator, and $I_{sat}$ is the saturation current value. As t is determined the 313 can be set by its control pins.

Furthermore, the final output signal $OUT_n$ from the last stage register 305 is also transmitted to the logic unit 315. In this case, the logic unit 315 is a XOR unit. Therefore, if the final output signal $OUT_n$ and the input signal IN both has a logic value 1 (i.e. the switch device 305 turns on), the output of the logic unit 315 will be 0 and the oscillator 313 will stop generating the clock signal CLK. It should be noted that the logic unit 315 can be removed according to different structure or design requirement of the switching circuit.

Briefly, the switch circuit according the embodiments of the present application can turn on the switch devices in order and stop the oscillator generating the clock signal when all the switch devices already turn on. By this way, the rush current problem of the prior art can be controlled. It should be noted that the above-mentioned embodiments are only for example but do not mean to limit the scope of the present invention. For example, the switch devices can be coupled to the $\overline{Q}$ terminal instead of Q terminal of the D flip flop, and the switch devices will turn on when the input signal of the data terminal D has a logic value 1. Additionally, the registers can be replaced with other registers besides the D flip flop. Such variation should fall in the scope of the present application. Further more, the registers 307, 309 and 311, the oscillator 313 and the XOR unit 315 can be considered as a switch controlling circuit according to an embodiment of the present application.

The switch circuit 300 according to the present can further include a control mechanism to directly turn on/off the switches in the switch circuit 300. For example, the switch circuit 300 can further include a control circuit 317, which can be programmable, to directly turn on/turn off the switch devices 301, 303 and 305 via setting or clearing the D flip flops 307, 309 and 311. In this embodiment, the switch circuit 300 includes a plurality of buffers 319, 321, 323, 325, 327 and 329, but it does not mean to limit the scope of the present application.

Figure 4:
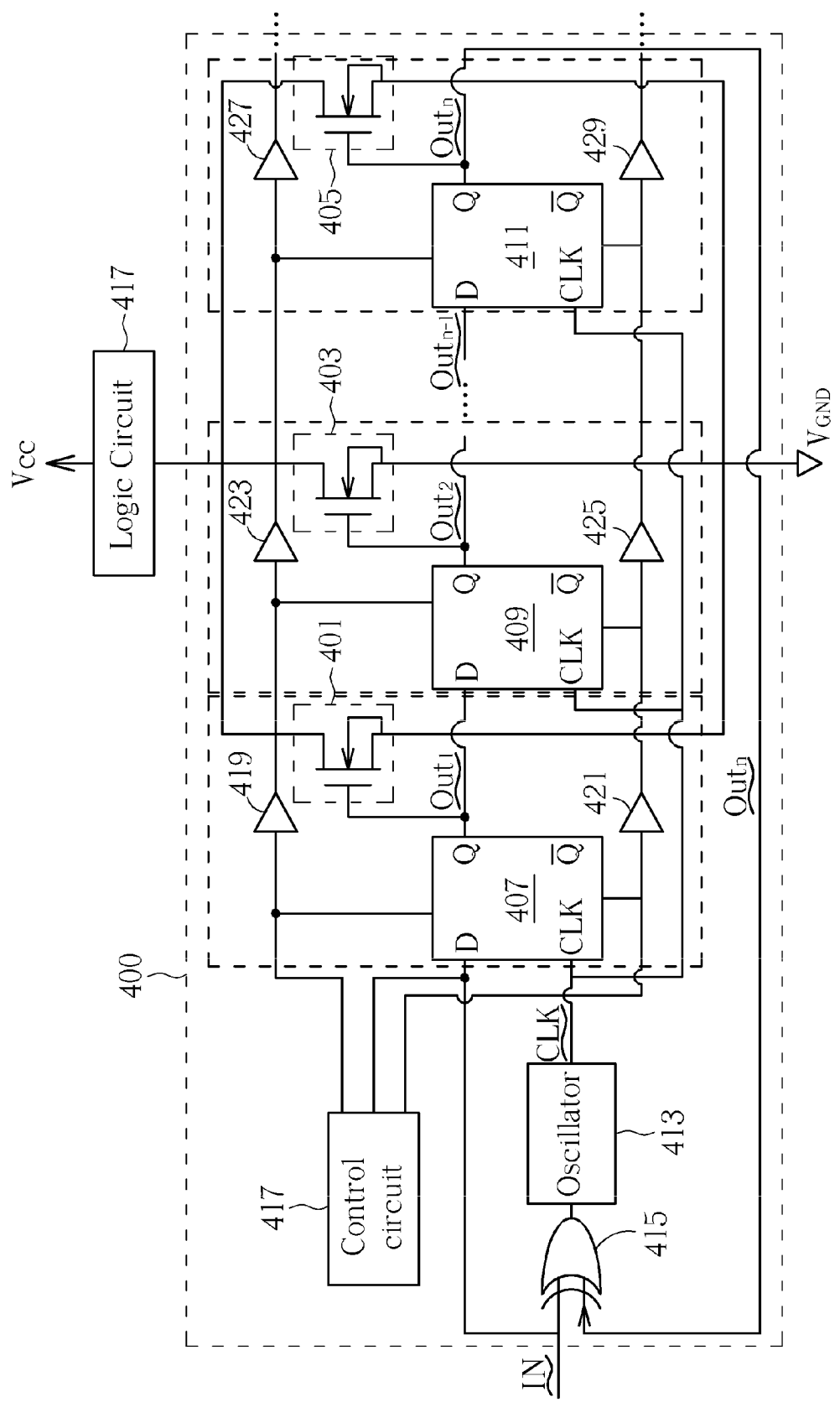
FIG. 4 is a circuit diagram illustrating a switch circuit according to a second embodiment of the present invention.

FIG. 4 is a circuit diagram illustrating a switch circuit 400 according to a second embodiment of the present invention, which is a footer type switch circuit. Comparing with the switch circuit 300 shown in FIG. 3, the switch circuit 400 also includes a plurality of switch devices 401, 403 and 405, a plurality of registers 407, 409 and 411 (D flip flop in this case, and only three of the registers are illustrated), an oscillator 413, and a logic unit 415 (XOR unit in this case). However, the switch circuit 400 is located between the logic circuit 417 and the ground voltage level $V_{GND}$ instead of located between the supply voltage Vcc and the logic circuit 417. Besides, switch devices 401, 403 and 405 in the switch circuit 400 are N-MOSFETs thus the switch devices 401, 403 and 405 in the switch circuit 400 will turn on when the output of each register has a logic value 1.

The rush current of the switch circuit 400 can be described as follows:

$$\text{Max } I_{rush} = \frac{T}{t} \times I_{sat} \qquad \text{Eq (4)}$$

$$T = \frac{C \times (V_{gs} - |V_{th}|)}{I_{sat}} \qquad \text{Eq (5)}$$

Combining Eq (4) and Eq (5), Eq (6) can be obtained:

$$\text{Max } I_{rush} = \frac{C \times (V_{gs} - |V_{th}|)}{t} \qquad \text{Eq (6)}$$

$V_{th}$ indicates the threshold value of N-MOSFET. T is the time when the capacitors in the logic circuit 320 are charged to a specific voltage level V such that the N-MOSFET changes from a saturation region to a linear region. That is, since the capacitors in the logic circuit initially include no charge therein, the N-MOSFETs of the switch circuit according to the embodiment of the present invention initially operate at a saturation region, thus the current flowing through the N-MOSFETs is saturation current. As time goes by, the capacitors accumulate some charge and voltage level thereon goes up. Accordingly, the voltage between a drain terminal and a source terminal of the N-MOSFET decreases and the N-MOSFET gradually operates from the saturation region to the linear region. Besides, t is a cycle time of the oscillator, and $I_{sat}$ is the saturation current value.

The same as the embodiment shown in FIG. 3, the switch circuit 400 according to the embodiment of the present invention can further include a control mechanism to directly turn on/off the switches in the switch circuit 400. Also, the switch circuit 400 can include a plurality of buffers 419, 421, 423, 425, 427 and 429.

Figure 5:
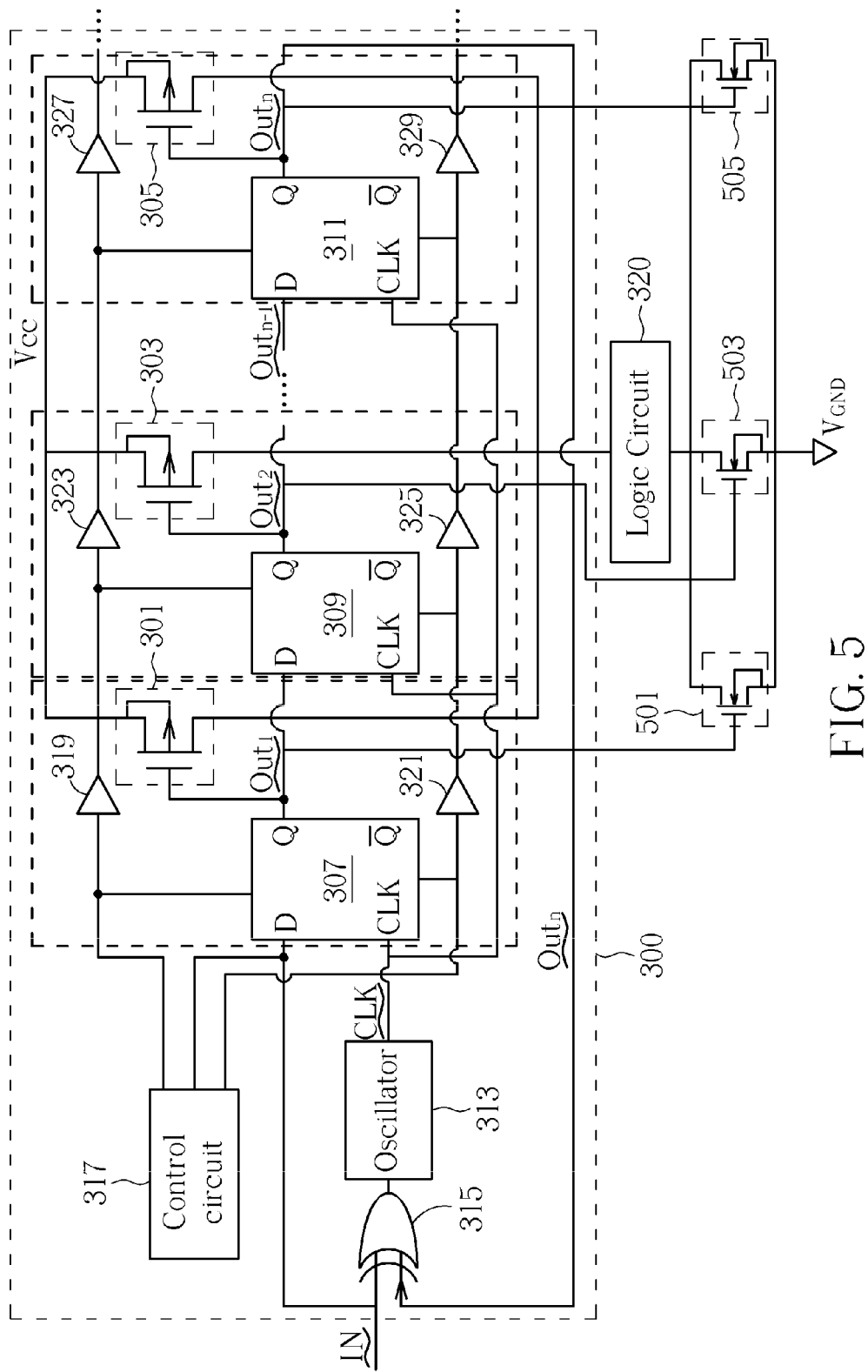
FIG. 5 is a circuit diagram illustrating a switch circuit according to a third embodiment of the present invention.

FIG. 5 is a circuit diagram illustrating a switch circuit according to a third embodiment of the present invention. The circuit structure shown in FIG. 5 is almost the same as which shown in FIG. 3, except the switches 501, 503 and 505 provided between the logic circuit 320 and the ground level. The control mechanism for controlling switches 301, 303 and 305 can also be applied to the switches 501, 503 and 505. By this way, the logic circuit can be completely isolated from supply voltage level $V_{cc}$ and ground level.

Figure 6:
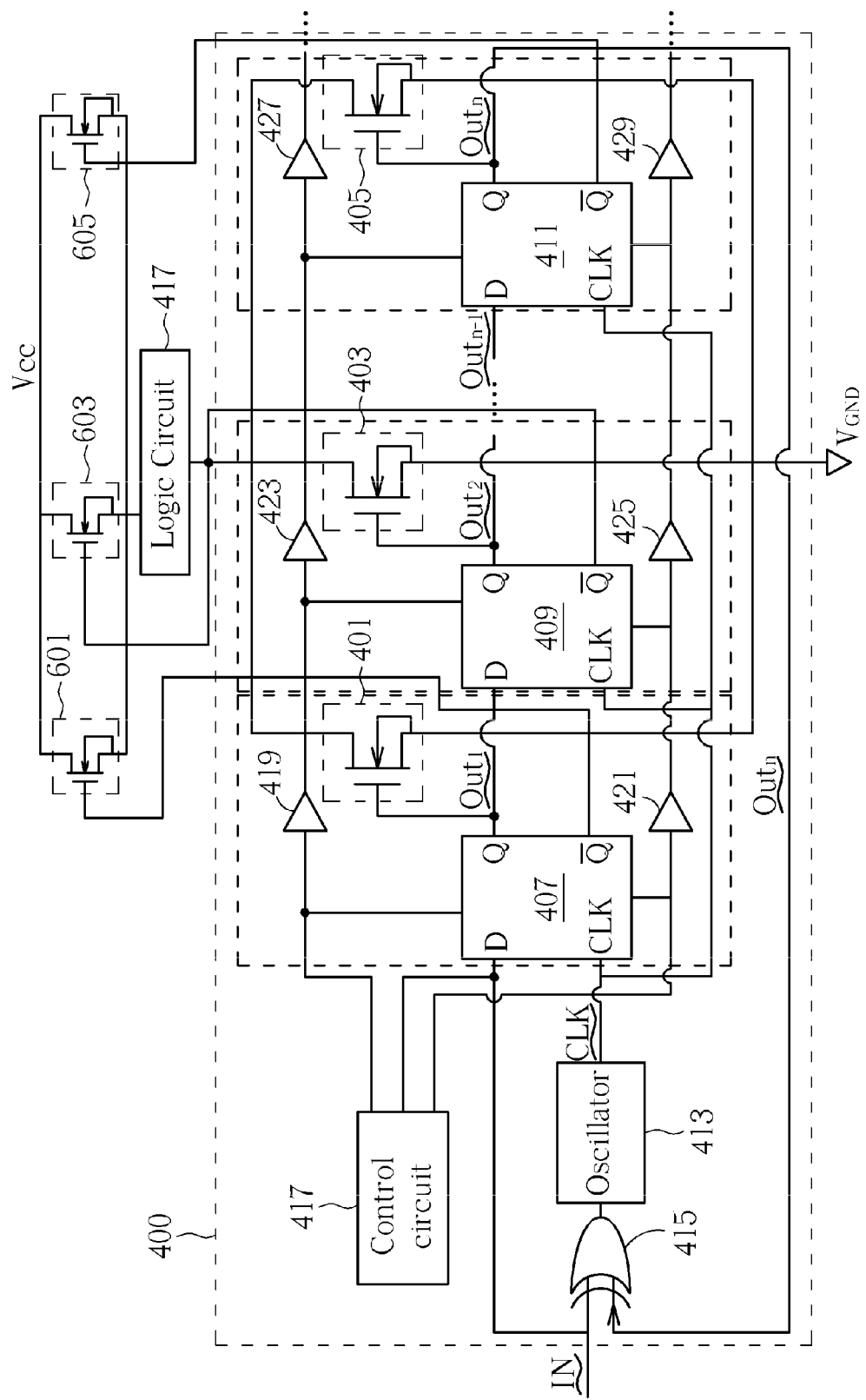
FIG. 6 is a circuit diagram illustrating a switch circuit according to a fourth embodiment of the present invention.

FIG. 6 is a circuit diagram illustrating a switch circuit according to a fourth embodiment of the present invention. The circuit structure shown in FIG. 6 is almost the same as which shown in FIG. 4, except the switches 601, 603 and 605 provided between the logic circuit 417 and the supply voltage level $V_{cc}$. The control mechanism for controlling switches 301, 303 and 305 can also be applied to the switches 501, 503 and 505. By this way, the logic circuit can be completely isolated from supply voltage level $V_{cc}$ and ground level.

Other detail operations of the switch circuit 400 are similar with which of switch circuit 300, thus are omitted for brevity here.

A switch controlling method can be obtained according to above-mentioned embodiments, which includes: generate a clock signal; and turn on a plurality of switch devices in order according to the clock signal and an input signal. Other detail steps can be obtained according to above-mentioned embodiments, thus are omitted for brevity here.

According to above-mentioned embodiments, rush current of the prior art can be controlled and the operation of the switch circuit can automatically stop when a last stage switch device turns off.

Those skilled in the art will readily observe that numerous modifications and alterations of the device and method may be made while retaining the teachings of the invention.

What is claimed is:

1. A switch controlling circuit, comprising:
a frequency programmable clock signal generator, for generating a frequency controllable clock signal;
a plurality of registers, comprising:
a first stage register, for receiving an input signal and the frequency controllable clock signal, and for outputting a first output signal, which is utilized to control a first switch device, according to the input signal and the frequency controllable clock signal; and
a second stage register, for receiving the first output signal and the frequency controllable clock signal, and for outputting a second output signal, which is utilized to control a second switch device, according to the first output signal and the frequency controllable clock signal; and
a logic unit, for controlling the frequency programmable clock signal generator to generate the frequency controllable clock signal according to the input signal and the second output signal.

2. The switch controlling circuit of claim 1, wherein the logic unit is a XOR unit.

3. The switch controlling circuit of claim 1, wherein at least one of the plurality of registers is a D flip flop.

4. The switch controlling circuit of claim 1, wherein a first power terminal of the first switch device and a second power terminal of the second switch device are connected to a first voltage level having a constant voltage value and a first target terminal of the first switch device and a second target terminal of the second switch device are connected to a target circuit.

5. The switch controlling circuit of claim 4, further comprising:
a third switch device, having a controlled terminal, for receiving the first output signal; and
a fourth switch device, having another controlled terminal, for receiving the second output signal,
wherein a third power terminal of the third switch device and a fourth power terminal of the fourth switch device are connected to a second voltage level and a third target terminal of the third switch device and a fourth target terminal of the fourth switch device are connected to the target circuit.

6. The switch controlling circuit of claim 1, wherein both the first register device and the second register device are D flip flops, and both the first switch device and the second switch device are MOSFETs coupled to one of Q and $\overline{Q}$ output terminals of the D flip flops identically.

7. The switch controlling circuit of claim 1, wherein the logic unit generates the frequency controllable clock signal only according to the input signal and the second output signal.

8. A switch circuit, comprising:
a first switch device;
a second switch device;
a frequency programmable clock signal generator, for generating a frequency controllable clock signal;
a plurality of registers, comprising:
a first stage register, for receiving an input signal and the frequency controllable clock signal, and for outputting a first output signal, which is utilized to control the first switch device, according to the input signal and the frequency controllable clock signal; and
a second stage register, for receiving the first output signal and the frequency controllable clock signal, and for outputting a second output signal, which is utilized to control the second switch device, according to the first output signal and the frequency controllable clock signal; and a logic unit, for controlling the frequency programmable clock signal generator to generate the frequency controllable clock signal according to the input signal and the second output signal.

9. The switch circuit of claim 8, wherein the logic unit is a XOR unit.

10. The switch circuit of claim 8, wherein at least one of the plurality of registers is a D flip flop.

11. The switch controlling circuit of claim 8, wherein a first power terminal of the first switch device and a second power terminal of the second switch device are connected to a first voltage level having a constant voltage value and a first target terminal of the first switch device and a second target terminal of the second switch device are connected to a target circuit.

12. The switch controlling circuit of claim 11, further comprising:
a third switch device, having a controlled terminal, for receiving the first output signal; and
a fourth switch device, having another controlled terminal, for receiving the second output signal,
wherein a third power terminal of the third switch device and a fourth power terminal of the fourth switch device are connected to a second voltage level and a third target terminal of the third switch device and a fourth target terminal of the fourth switch device are connected to the target circuit.

13. The switch controlling circuit of claim 12, wherein both the first register and the second register are D flip flops, and both the first switch device and the second switch device are MOSFETs coupled to Q output terminals of the D flip flops identically and both the third switch device and the fourth switch device are MOSFETs coupled to $\overline{Q}$ output terminals of the D flip flops identically.

14. The switch controlling circuit of claim 8, wherein the logic unit generates the frequency controllable clock signal only according to the input signal and the second output signal.

15. A switch controlling method, comprising:
generating a frequency controllable clock signal;
receiving an input signal and the frequency controllable clock signal to output a first output signal, which is utilized to control a first switch device, according to the input signal and the frequency controllable clock signal;
receiving the first output signal and the frequency controllable clock signal to output a second output signal, which is utilized to control a second switch device, according to the first output signal and the frequency controllable clock signal; and
controlling a frequency programmable clock signal generator to generate the frequency controllable clock signal according to the input signal and the second output signal.

16. The switch controlling method of claim 15, wherein the step of controlling a frequency programmable clock signal generator generates the frequency controllable clock signal only according to the input signal and the second output signal.

17. A switch controlling circuit, comprising:
a frequency programmable clock signal generator, for generating a frequency controllable clock signal;
a plurality of registers, comprising:
a first stage register, for receiving an input signal and the frequency controllable clock signal, and for outputting a first output signal, which is utilized to control a first switch device, according to the input signal and the frequency controllable clock signal; and
a second stage register, for receiving the first output signal and the frequency controllable clock signal, and for outputting a second output signal, which is utilized to control a second switch device, according to the first output signal and the frequency controllable clock signal, wherein a first power terminal of the first switch device and a second power terminal of the second switch device are connected to a first voltage level and a first target terminal of the first switch device and a second target terminal of the second switch device are connected to a target circuit; and
a third switch device, having a controlled terminal, for receiving the first output signal; and
a fourth switch device, having another controlled terminal, for receiving the second output signal, wherein a third power terminal of the third switch device and a fourth power terminal of the fourth switch device are connected to a second voltage level and a third target terminal of the third switch device and a fourth target terminal of the fourth switch device are connected to the target circuit.

* * * * *